(12) United States Patent
Honda

(10) Patent No.: US 9,842,854 B2
(45) Date of Patent: Dec. 12, 2017

(54) MANUFACTURING METHOD OF A SEMICONDUCTOR DEVICE AND SEMICONDUCTOR DEVICE

(71) Applicant: TOSHIBA MEMORY CORPORATION, Minato-ku (JP)

(72) Inventor: Shingo Honda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/241,210

(22) Filed: Aug. 19, 2016

(65) Prior Publication Data
US 2017/0330892 A1 Nov. 16, 2017

Related U.S. Application Data

(60) Provisional application No. 62/335,243, filed on May 12, 2016.

(51) Int. Cl.
| | | |
|---|---|---|
| *H01L 27/112* | (2006.01) | |
| *H01L 27/115* | (2017.01) | |
| *H01L 21/8246* | (2006.01) | |
| *H01L 21/8247* | (2006.01) | |
| *H01L 27/11582* | (2017.01) | |
| *H01L 21/768* | (2006.01) | |
| *H01L 27/1157* | (2017.01) | |
| *H01L 23/522* | (2006.01) | |
| *H01L 23/528* | (2006.01) | |

(52) U.S. Cl.
CPC .. *H01L 27/11582* (2013.01); *H01L 21/76816* (2013.01); *H01L 21/76897* (2013.01); *H01L 23/528* (2013.01); *H01L 23/5226* (2013.01); *H01L 27/1157* (2013.01)

(58) Field of Classification Search
CPC ... H01L 27/11521; H01L 27/11551–27/11556; H01L 27/11568; H01L 27/11578–27/11582
See application file for complete search history.

(56) References Cited

U.S. PATENT DOCUMENTS

| | | | |
|---|---|---|---|
| 7,982,261 B2 | 7/2011 | Kidoh et al. | |
| 2010/0176440 A1* | 7/2010 | Omura | H01L 27/11578 257/324 |

(Continued)

FOREIGN PATENT DOCUMENTS

| | | |
|---|---|---|
| JP | 5300419 | 9/2013 |
| JP | 2015-177134 | 10/2015 |
| JP | 2016-62952 | 4/2016 |

*Primary Examiner* — Robert Bachner
*Assistant Examiner* — Molly Reida
(74) *Attorney, Agent, or Firm* — Oblon, McClelland, Maier & Neustadt, L.L.P.

(57) ABSTRACT

According to one embodiment, a first stacked body in which first insulation layers and second insulation layers are alternately stacked is formed, a first hole penetrating through the first stacked body is formed, a sacrifice film is embedded in the first hole, the sacrifice film is protruded from the first stacked body to form a protrusion portion on the first stacked body, a second stacked body in which third insulation layers and fourth insulation layers are alternately stacked is formed on the first stacked body, and a second hole penetrating through the second stacked body is formed.

4 Claims, 9 Drawing Sheets

(56) References Cited

U.S. PATENT DOCUMENTS

| | | | |
|---|---|---|---|
| 2011/0312174 A1* | 12/2011 | Lee | H01L 27/11582 438/595 |
| 2015/0263037 A1 | 9/2015 | Noda | |
| 2016/0079270 A1 | 3/2016 | Komori et al. | |

\* cited by examiner

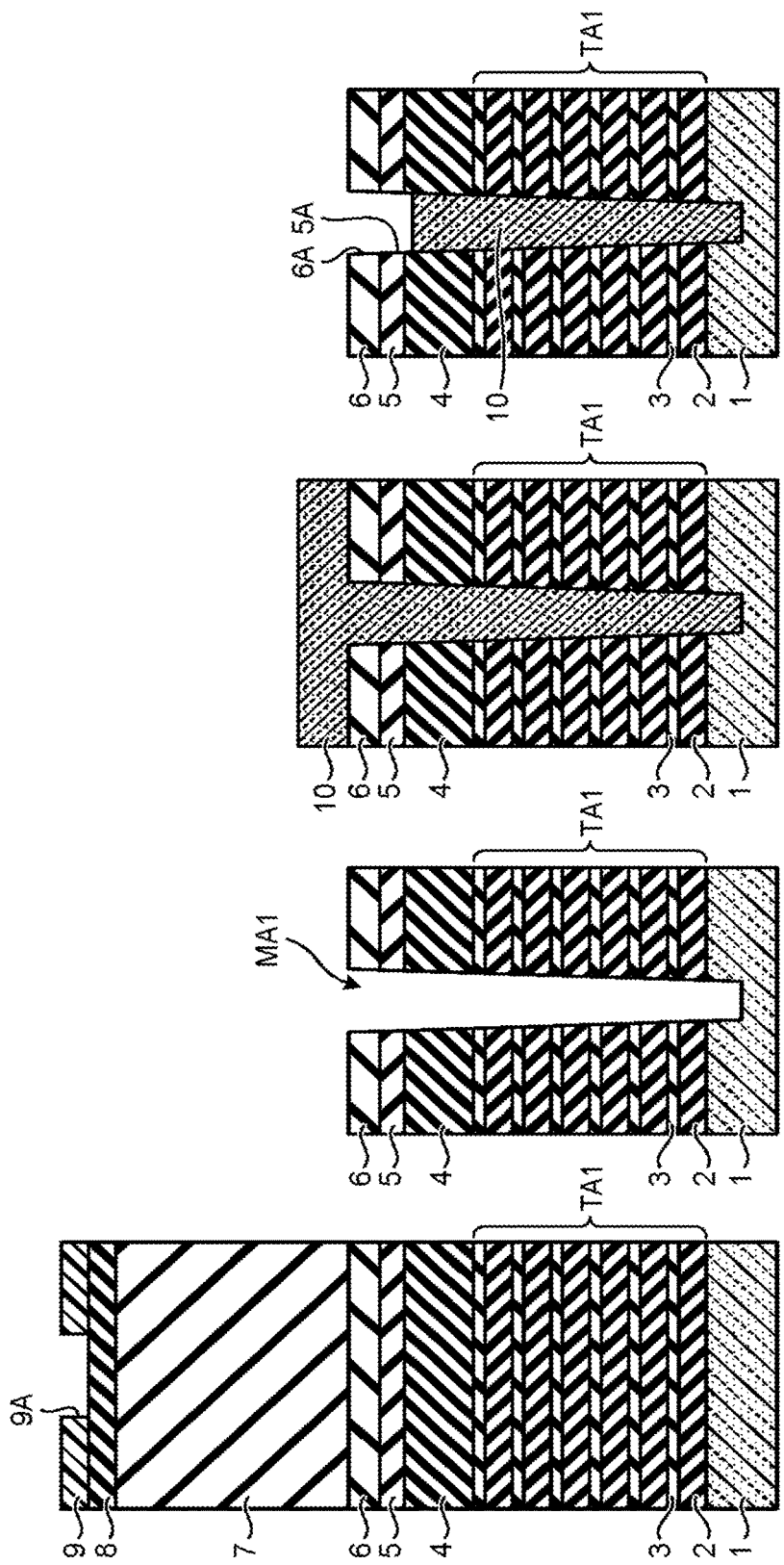

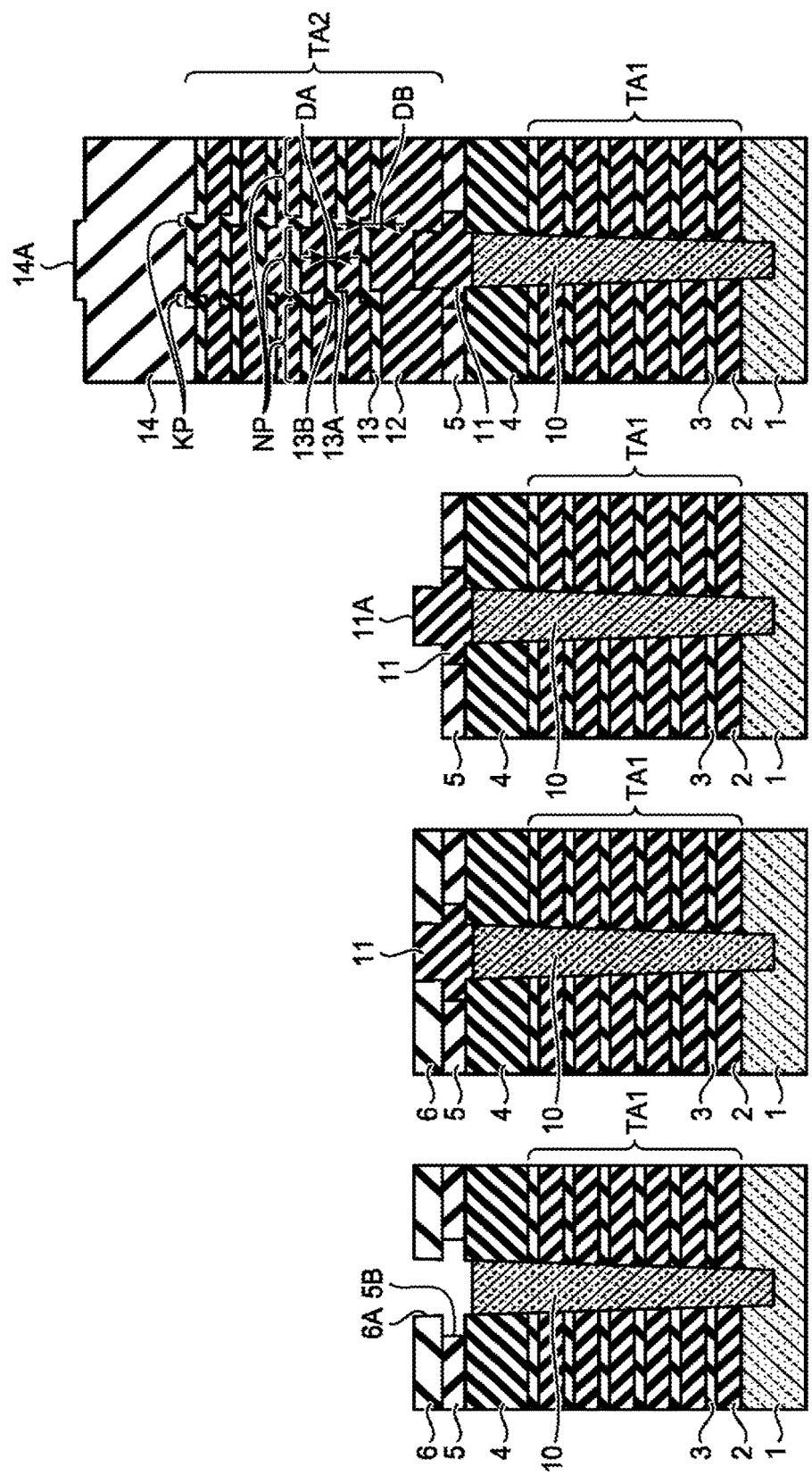

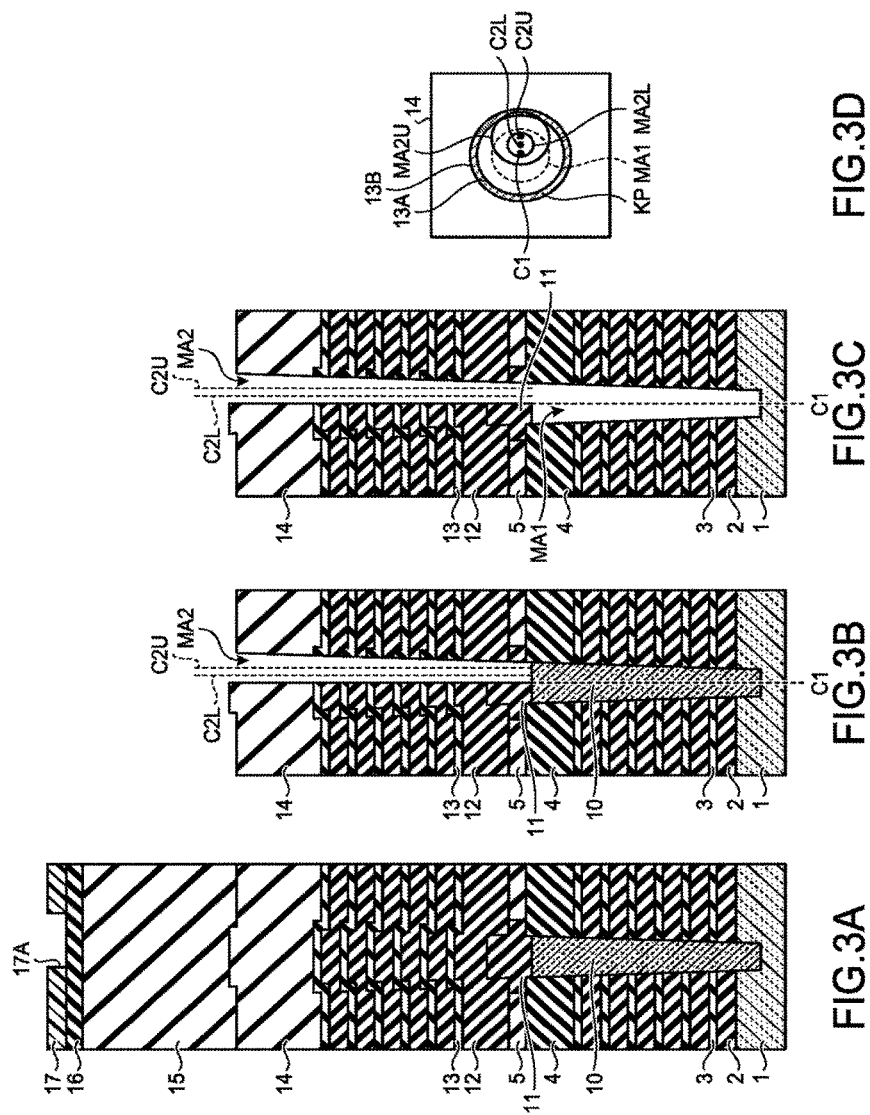

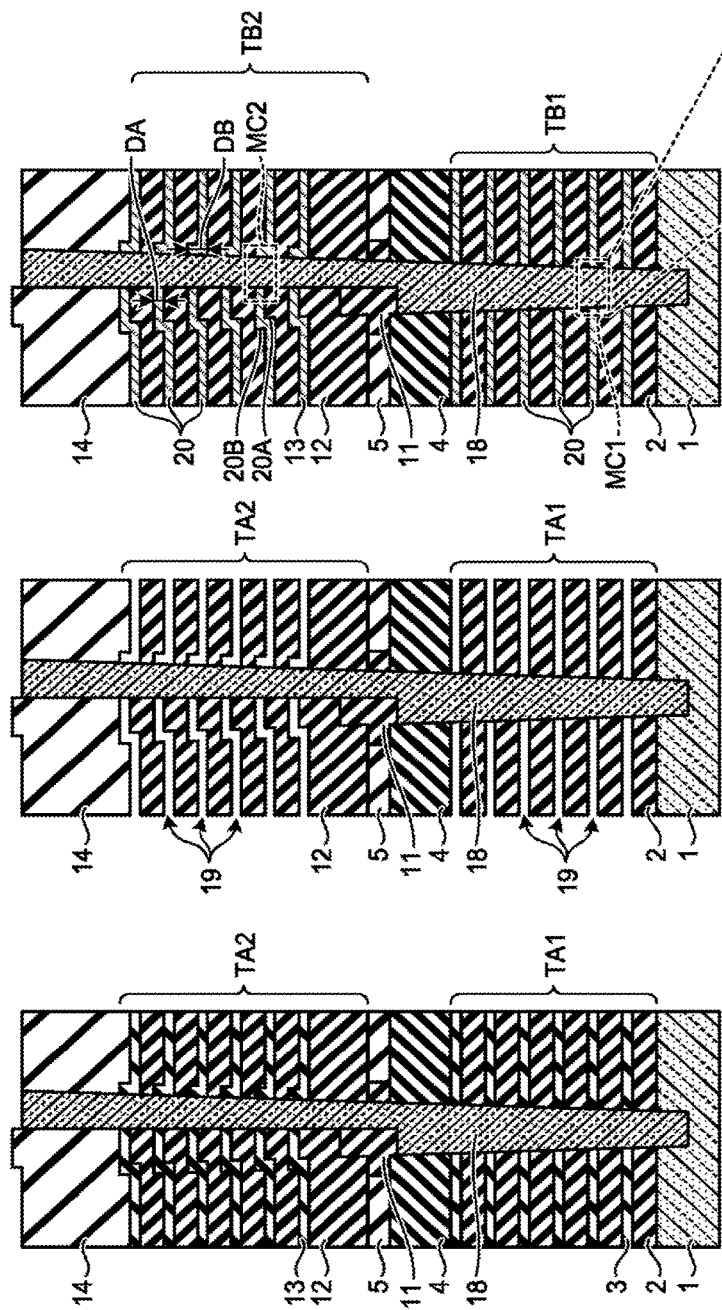
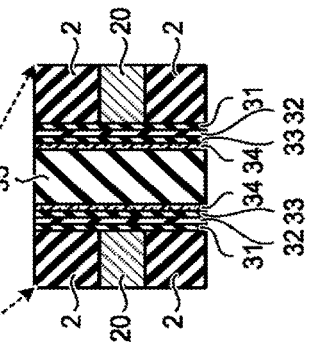
FIG.4A
FIG.4B
FIG.4C
FIG.4D

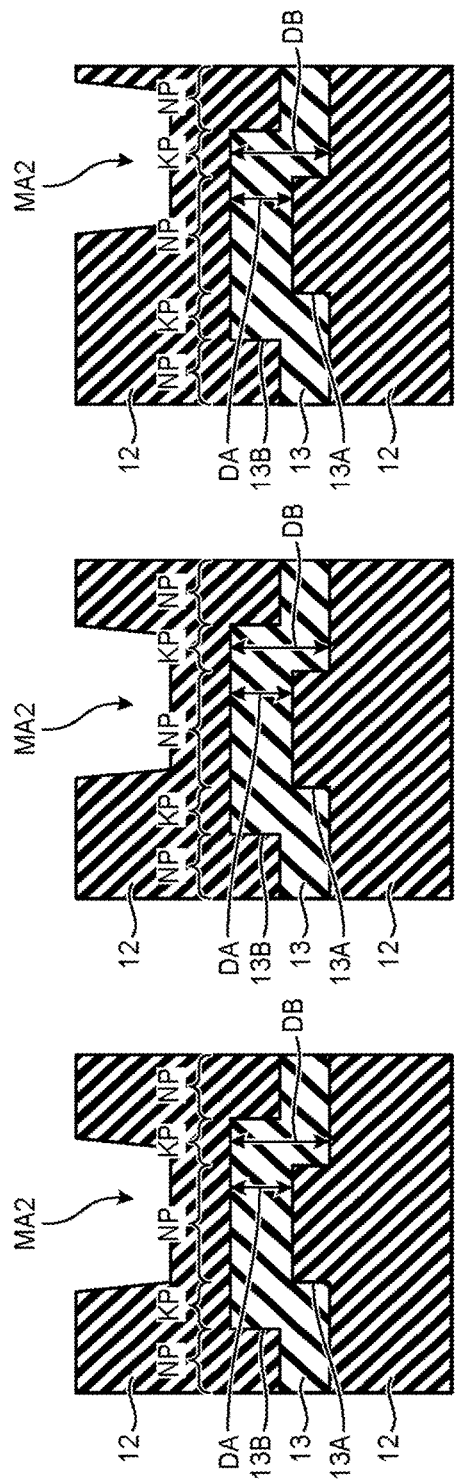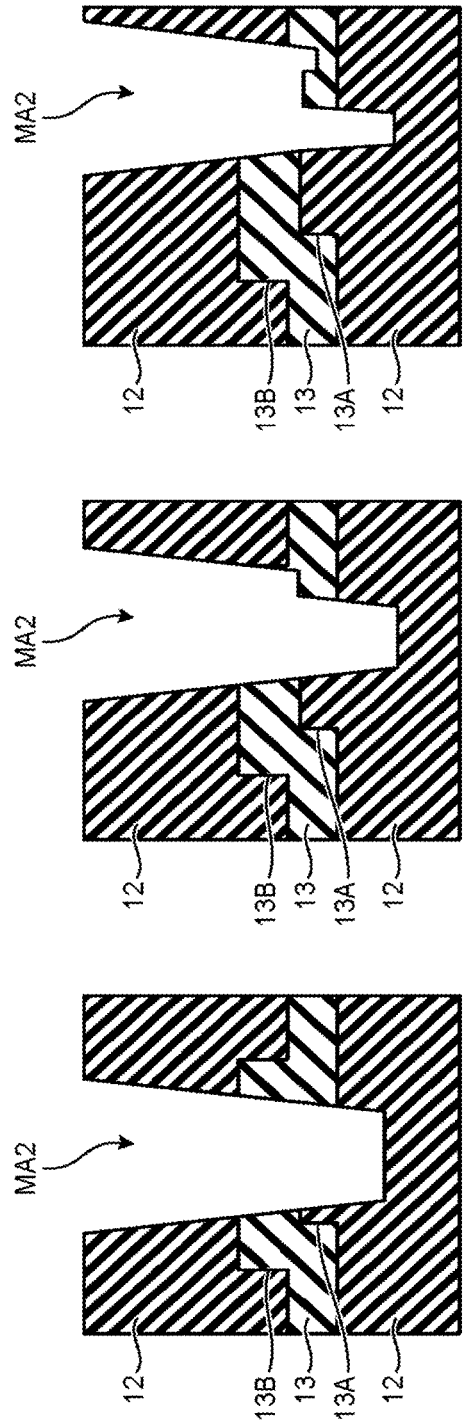

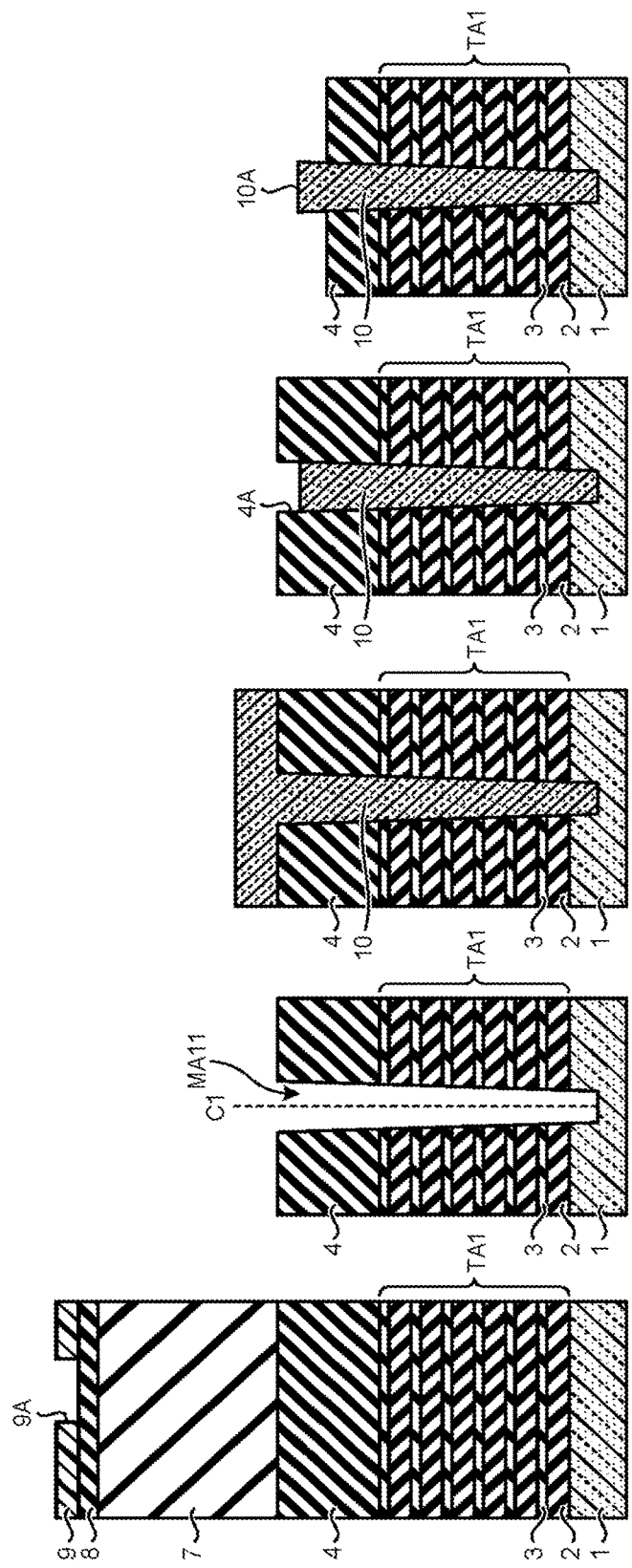

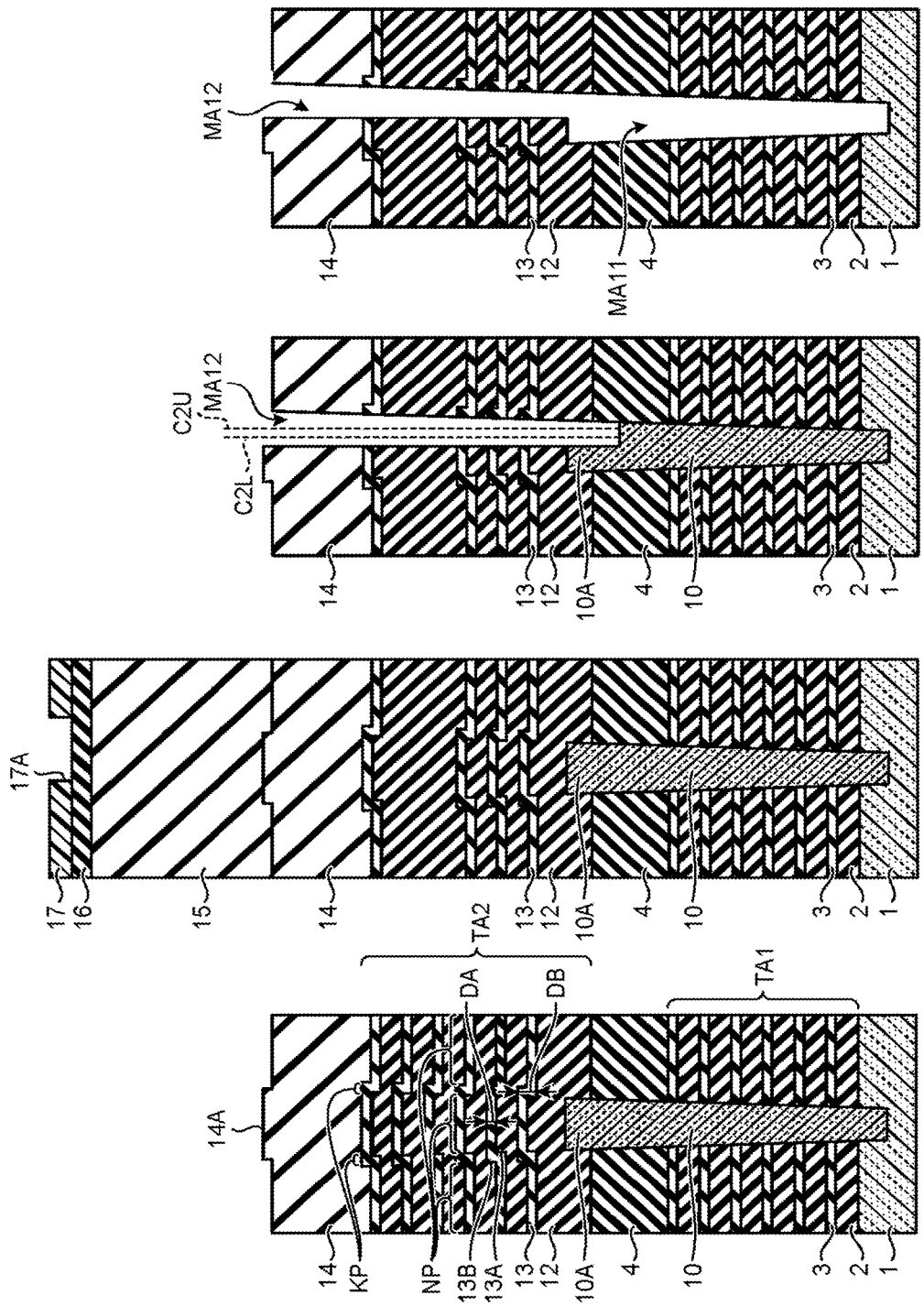

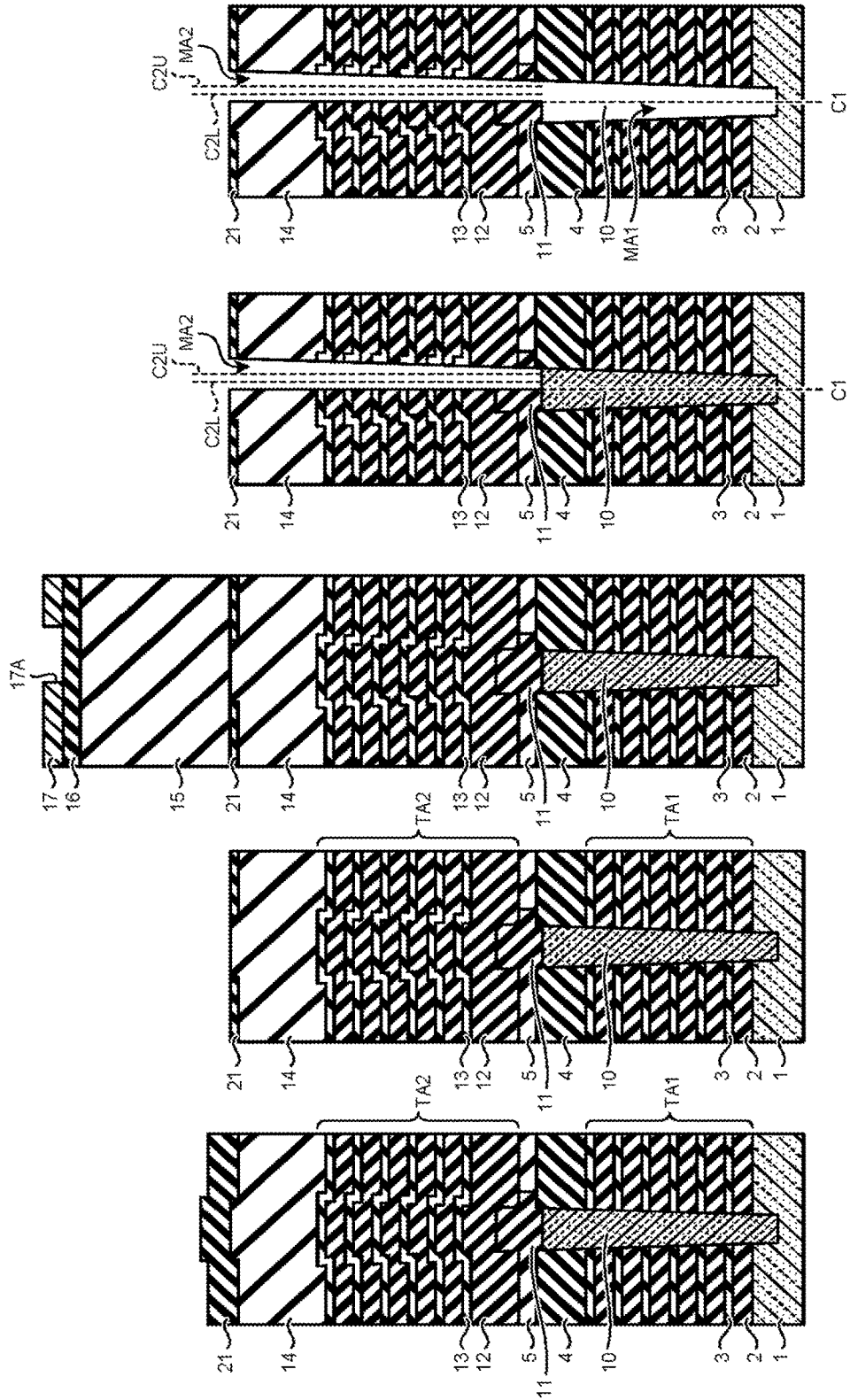

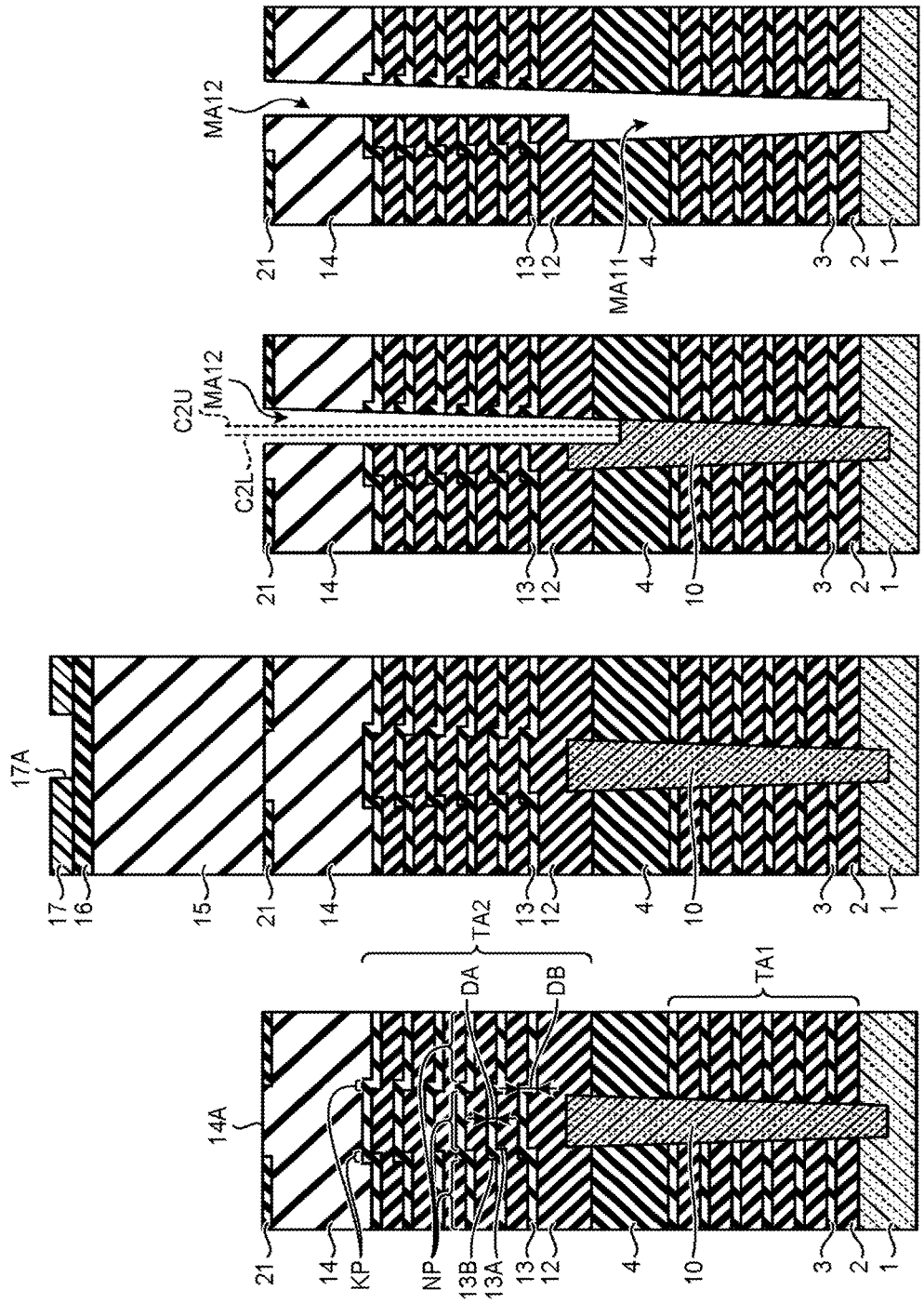

MANUFACTURING METHOD OF A SEMICONDUCTOR DEVICE AND SEMICONDUCTOR DEVICE

CROSS-REFERENCE TO RELATED APPLICATIONS

This application is based upon and claims the benefit of priority from U.S. Provisional Application No. 62/335,243, filed on May 12, 2016; the entire contents of which are incorporated herein by reference.

FIELD

Embodiments described herein relate generally to a manufacturing method of a semiconductor device and the semiconductor device.

BACKGROUND

To achieve high integration of a non-volatile semiconductor storage device, memory cells may be arranged three-dimensionally. In this case, there is demand for increasing the aspect ratio of a hall pattern to increase the efficiency of a memory cell stacking process.

BRIEF DESCRIPTION OF THE DRAWINGS

FIGS. 1A to 1D are cross-sectional views illustrating a manufacturing method of a semiconductor device according to a first embodiment;

FIGS. 2A to 2D are cross-sectional views illustrating the manufacturing method of a semiconductor device according to the first embodiment;

FIGS. 3A to 3C are cross-sectional views illustrating the manufacturing method of a semiconductor device according to the first embodiment, and FIG. 3D is a plane view illustrating the position of a hole at the step of FIG. 3C;

FIGS. 4A to 4C are cross-sectional views illustrating the manufacturing method of a semiconductor device according to the first embodiment, and FIG. 4D is a cross-sectional view of a configuration example of the memory cells illustrated in FIG. 4C;

FIGS. 5A to 5F are cross-sectional views illustrating a method for self-alignment contact between an upper hole and a lower hole according to the first embodiment;

FIGS. 6A to 6E are cross-sectional views illustrating a manufacturing method of a semiconductor device according to a second embodiment;

FIGS. 7A to 7D are cross-sectional views illustrating the manufacturing method of a semiconductor device according to the second embodiment;

FIGS. 8A to 8E are cross-sectional views illustrating a manufacturing method of a semiconductor device according to a third embodiment; and FIGS. 9A to 9D are cross-sectional views illustrating a manufacturing method of a semiconductor device according to a fourth embodiment.

DETAILED DESCRIPTION

In general, according to one embodiment, a first stacked body in which first insulation layers and second insulation layers are alternately stacked is formed, a first hole penetrating through the first stacked body is formed, a sacrifice film is embedded in the first hole, the sacrifice film is protruded from the first stacked body to form a protrusion portion on the first stacked body, a second stacked body in which third insulation layers and fourth insulation layers are alternately stacked to cover the protrusion portion is formed on the first stacked body, a second hole penetrating through the second stacked body is formed, and the sacrifice film in the first hole is removed.

Exemplary embodiments of manufacturing method of a semiconductor device will be explained below in detail with reference to the accompanying drawings. The present invention is not limited to the following embodiments.

First Embodiment

FIGS. 1A to 1D, 2A to 2D, 3A to 3C, and 4A to 4C are cross-sectional views illustrating a manufacturing method of a semiconductor device according to a first embodiment. FIG. 3D is a plane view illustrating the position of a hole at the step of FIG. 3C, and FIG. 4D is a cross-sectional view of a configuration example of the memory cells illustrated in FIG. 4C.

As illustrated in FIG. 1A, a stacked body TA1 is formed on a base layer 1. The base layer 1 may be a wafer, an insulation layer, or a semiconductor layer. An integrated circuit, wiring, and the like may be formed on the base layer 1. In the stacked body TA1, insulation layers 2 and 3 of different materials are alternately stacked by a method such as CVD. The insulation layers 2 and 3 may be formed from materials different in etching rate. For example, the insulation layers 2 may be formed from silicon oxide films, and the insulation layers 3 may be formed from silicon nitride films. The film thickness of the insulation layers 2 and 3 may be set to about several tens nm, for example. The numbers of the insulation layers 2 and 3 may be set to about several tens to several hundreds, for example.

Next, an insulation layer 4 is formed on the stacked body TA1 by a method such as low pressure chemical vapor deposition (LPCVD). Then, an insulation layer 5 is formed on the insulation layer 4 by a method such as plasma CVD. Further, an insulation layer 6 is formed on the insulation layer 5 by a method such as LPCVD. The materials for the insulation layers 4 to 6 may be tetraethyl orthosilicate (TEOS) films. The film formation temperature of the insulation layer 5 can be lower than film formation temperatures of the insulation layers 4 and 6. In this case, the insulation layer 5 can be lower in denseness than the insulation layers 4 and 6. Accordingly, the insulation layer 5 can be higher in etching rate than the insulation layers 4 and 6. For example, the etching rate of the insulation layer 5 can be set to 1.2 to 2 times higher than the etching rates of the insulation layers 4 and 6.

Next, an advanced patterning film (APF) 7 is formed on the insulation layer 6 by a method such as CVD. The APF 7 can be formed from a material lower in etching rate than the insulation layers 2 to 6. For example, the APF 7 can be formed from a carbon film.

Next, a dielectric anti-reflective coating (DARC) film 8 is formed on the APF 7 by a method such as CVD. The DARC film 8 can be formed from a SiON film, for example.

Next, a resist pattern 9 is formed on the DARC film 8 by the use of a photolithography technique. The resist pattern 9 has an opening 9A.

Next, as illustrated in FIG. 1B, the DARC film 8 and the APF 7 are etched with the resist pattern 9 as a mask to transfer the opening 9A to the DARC film 8 and the APF 7. Then, the stacked body TA1 and the insulation layers 4 to 6 are etched with the APF 7 to which the opening 9A is transferred as a mask to form a memory hole MA1 in the stacked body TA1 and the insulation layers 4 to 6. The diameter of the memory hole MA1 can be set to several tens nm, for example. The memory hole MA1 can be formed vertically to the stacked body TA1. After the formation of the memory hole MA1, the APF 7 is removed by a method such as ashing.

Next, as illustrated in FIG. 1C, a sacrifice film 10 is embedded in the memory hole MA1 by a method such as CVD. The sacrifice film 10 can be formed from a material lower in etching rate than the stacked body TA1 and the insulation layers 4 to 6. For example, the sacrifice film 10 can be formed from polycrystalline silicon or amorphous silicon.

Next, as illustrated in FIG. 1D, the sacrifice film 10 is etched back to remove the sacrifice film 10 from positions 5A and 6A of the insulation layers 5 and 6. At that time, the depth of removal portion of the sacrifice film 10 can be about 100 to 200 nm, for example. The sacrifice film 10 may be etched back by wet etching or dry etching such as reactive ion etching (RIE). The etching agent for wet etching can be phosphoric acid, for example. The etching agent for dry etching can be $Cl_2$ gas, for example.

Next, as illustrated in FIG. 2A, the insulation layer 5 is subjected to side etching to back the insulation layer 5 down to a backdown position 5B. At that time, buffered hydrogen fluoride (BHF) can be used as an etching agent, for example.

Next, as illustrated in FIG. 2B, an embedding material 11 is embedded in the backdown position 5B of the insulation layer 5 and the position 6A of the insulation layer 6 by a method such as CVD. The embedding material 11 can be formed from a material lower in etching rate than the insulation layer 6. For example, the embedding material 11 can be formed from a silicon nitride film. Then, the entire embedding material 11 is etched back to expose the surface of the insulation layer 6 to the outside.

Next, as illustrated in FIG. 2C, the insulation layer 6 is selectively etched to remove the insulation layer 6 with the embedding material 11 left. At that time, the embedding material 11 can be protruded in a convex form from the insulation layer 5. Accordingly, a protrusion portion 11A formed from part of the embedding material 11 can be arranged on the memory hole MA1. The insulation layer 6 may be etched by wet etching or dry etching such as RIE.

Next, as illustrated in FIG. 2D, a stacked body TA2 is formed on the insulation layer 5 and the embedding material 11. In the stacked body TA2, insulation layers 12 and 13 of different materials are alternately stacked by a method such as CVD. The insulation layers 12 and 13 may be formed from materials different in etching rate. For example, the insulation layers 12 may be formed from a silicon oxide films, and the insulation layers 13 may be formed from silicon nitride films. The film thickness of the insulation layers 12 and 13 may be set to about several tens nm, for example. The numbers of the insulation layers 12 and 13 may be set to about several tens to several hundreds, for example.

At that time, steps 13A are formed on the lower surfaces of the insulation layers 13 in correspondence with the protrusion portion 11A. Steps 13B are formed on the upper surfaces of the insulation layers 13 in correspondence with the protrusion portion 11A. The steps 13A and 13B can be formed in a convex shape on the memory hole MA1. The horizontal positions of thick portions KP can be equal between the lower insulation layers 13 and the upper insulation layers 13 provided on the stacked body TA2. Film thickness differences are generated at the steps 13A and 13B on the insulation layers 13. When the film thickness of the insulation layers 13 at the steps 13A and 13B is designated as DB and the film thickness of the insulation layers 13 on the inside of the steps 13A and the outside of the steps 13B is designated as DA, the relationship DB>DA holds. Accordingly, the thick portions KP are formed between the steps 13A and 13B of the insulation layers 13. Thin portions NP are formed between the inside of the steps 13A and the outside of the steps 13B.

Next, an insulation layer 14 is formed on the stacked body TA2 by a method such as CVD. At that time, a step 14A is formed on the insulation layer 14 in correspondence with the protrusion portion 11A.

Next, as illustrated in FIG. 3A, an APF 15 is formed on the insulation layer 14 by a method such as CVD. The APF 15 can be formed from a material lower in etching rate than the insulation layers 12 to 14. For example, the APF 15 can be formed from a carbon film.

Next, a DARC film 16 is formed on the APF 15 by a method such as CVD. The DARC film 16 can be formed from a SiON film, for example.

Next, a resist pattern 17 is formed on the DARC film 16 by the use of a photolithography technique. The resist pattern 17 has an opening 17A. In the example of FIG. 3A, the central position of the opening 17A is misaligned with a central position C1 of the memory hole MA1.

Next, as illustrated in FIG. 3B, the DARC film 16 and the APF 15 are etched with the resist pattern 17 as a mask to transfer the opening 17A to the DARC film 16 and the APF 15. Then, the stacked body TA2 and the insulation layer 14 are etched with the APF 15 to which the opening 17A is transferred as a mask to form a memory hole MA2 in the stacked body TA2 and the insulation layer 14. The diameter of the memory hole MA2 may be set to about several tens nm, for example. The memory hole MA2 can be inclined in the stacked body TA2.

That is, when the central position of the opening 17A is misaligned with the central position C1 of the memory hole MA1, a central position C2U of top surface of the memory hole MA2 is misaligned with the central position C1 of the memory hole MA1. Then, in the course of the etching from the upper layers to the lower layers of the insulation layers 12 and 13, some part of the outer periphery of the memory hole MA2 passes through the thick portions KP, and the remaining part of the outer periphery of the memory hole MA2 passes through the thin portions NP. When the etching rates of the insulation layers 12 and 13 are different, the progress of the etching can be slowed in the case where the outer periphery of the memory hole MA2 passes through the thick portions KP as compared to the case where the outer periphery of the memory hole MA2 passes through the thin portions NP. Accordingly, the memory hole MA2 can be inclined from the thick portions KP toward the thin portions NP. At that time, by arranging the thick portions KP around the memory hole MA1, the memory hole MA2 can be inclined toward the central position C1 of the memory hole MA1. Accordingly, a central position C2L of bottom surface of the memory hole MA2 can be made close to the central position C1 of the memory hole MA1, and the accuracy of joining the memory hole MA1 and the memory hole MA2 can be improved in a self-alignment manner.

FIGS. 5A to 5F are cross-sectional views illustrating a self-alignment contact method of an upper hole and a lower hole according to the first embodiment.

Referring to FIG. 5A, the central position of the opening 17A is not misaligned with the central position C1 of the memory hole MA1. In this case, as illustrated in FIG. 5B, when the etching proceeds from the upper layers to the lower layers of the insulation layers 12 and 13, the outer periphery of the memory hole MA2 does not pass through the thick portions KP but passes through the thin portions NP inside the thick portion KP. Accordingly, the memory hole MA2 can be vertically formed in the stacked body TA2.

Referring to FIG. 5C, the central position of the opening 17A is slightly misaligned with the central position C1 of the memory hole MA1. The amount of misalignment can be about 5 μm, for example. In this case, as illustrated in FIG. 5D, when the etching proceeds from the upper layers to the lower layers of the insulation layers 12 and 13, part of the outer periphery of the memory hole MA2 passes through the thick portions KP, and the remaining part of the outer periphery of the memory hole MA2 passes through the thin portions NP. Accordingly, the memory hole MA2 can be inclined from the thick portions KP toward the thin portions NP.

Referring to FIG. 5E, the central position of opening 17A is significantly misaligned with the central position C1 of the memory hole MA1. The amount of misalignment can be about 12 μm, for example. In this case, as illustrated in FIG. 5F, when the etching proceeds from the upper layers to the lower layers of the insulation layers 12 and 13, the front end of the memory hole MA2 is divided when passing through the thick portions KP. When the amount of misalignment is significantly large as described above, the resist pattern 17 can be removed from the DARC film 16 and then applied again such that the amount of misalignment falls within a prescribed value.

At that time, as illustrated in FIG. 3D, the thick portions KP can be arranged in a ring shape on the memory hole MA1. Accordingly, when the central position of the opening 17A in the resist pattern 17 is misaligned with the central position C1 of the memory hole MA1 in any direction, the central position C2L of bottom surface MA2L of the memory hole MA2 can be made close to the central position C1 of the memory hole MA1.

By forming the steps 13A and 13B in a convex shape on the memory hole MA1, the horizontal position of the thick portions KP can be equal between the lower insulation layers 13 and the upper insulation layers 13. This prevents the diameter of the thick portions KP from becoming smaller from the lower layers to the upper layers of the insulation layers 13. In addition, even when the central position C2U of top surface MA2U of the memory hole MA2 is misaligned with the central position C1 of the memory hole MA1, the central position C2L of bottom surface MA2L of the memory hole MA2 can be made close to the central position C1 of the memory hole MA1. The distance between the central position C2L of bottom surface MA2L of the memory hole MA2 and the central position C1 of the memory hole MA1 can be shorter than the distance between the central position C2U of top surface MA2U of the memory hole MA2 and the central position C1 of the memory hole MA1.

Referring to FIG. 3B, after the formation of the memory hole MA2, the APF 15 is removed by a method such as ashing.

Next, as illustrated in FIG. 3C, the sacrifice film 10 is selectively etched to remove the sacrifice film 10 from the memory hole MA1. The etching agent can be phosphoric acid, for example.

Next, as illustrated in FIG. 4A, a columnar body 18 is embedded in the memory holes MA1 and MA2 by a method such as CVD. The columnar body 18 can have a memory film for storing data along the inner peripheries of the memory holes MA1 and MA2. The memory film can be provided continuously without intermission from the memory hole MA1 to the memory hole MA2.

Next, as illustrated in FIG. 4B, the insulation layers 3 and 13 are selectively etched to form air gaps 19 between the insulation layers 2 and between the insulation layers 12.

Next, as illustrated in FIG. 4C, conductive layers 20 are embedded in the air gaps 19 by a method such as CVD. At that time, a stacked body TB1 is formed on the base layer 1. In the stacked body TB1, the insulation layers 2 and the conductive layers 20 are alternately stacked. The stacked body TB1 is provided with the memory hole MA1. A stacked body TB2 is formed on the stacked body TB1. In the stacked body T22, the insulation layers 12 and the conductive layers 20 are alternately stacked. The stacked body TB2 is provided with the memory hole MA2. The columnar body 18 is embedded in the memory holes MA1 and MA2. The material for the conductive layers 20 can be tungsten or polycrystalline silicon, for example. Steps 20A are formed on the lower surfaces of the conductive layers 20 in the stacked body TB2 in correspondence with the steps 13A on the insulation layers 13. Steps 20B are formed on the upper surfaces of the conductive layers 20 in the stacked body TB2 in correspondence with the steps 13B on the insulation layers 13. At that time, film thickness differences are generated at the positions of the steps 20A and 20B on the conductive layers 20 of the stacked body TB2. The top and bottom conductive layers 20 of the stacked bodies TB1 and TB2 can be used as select gate lines in an NAND flash memory. The intermediate conductive layers 20 of the stacked bodies TB1 and TB2 can be used as word lines in the NAND flash memory.

As illustrated in FIG. 4D, a central body 35 is formed at the center of the columnar body 18. A semiconductor layer 34 is formed between the inner surfaces of the memory holes MA1 and MA2 and the central body 35. A tunnel insulation film 33 is formed between the inner surfaces of the memory holes MA1 and MA2 and the semiconductor layer 34. A charge trap layer 32 is formed between the inner surfaces of the memory holes MA1 and MA2 and the tunnel insulation film 33. A block insulation film 31 is formed between the inner surfaces of the memory holes MA1 and MA2 and the charge trap layer 32. The semiconductor layer 34 can be formed from amorphous silicon, for example. The central body 35, the tunnel insulation film 33, and the block insulation film 31 can be formed from silicon oxide films, for example. The charge trap layer 32 can be used as a memory film for storing data. The charge trap layer 32 may be formed from a silicon nitride film or an ONO film (three-layer structure of silicon oxide film/silicon nitride film/silicon oxide film). The configuration of FIG. 4D can be used as memory cells MC1 and MC2 in the NAND flash memory.

In the embodiment described above, the memory holes MA1 and MA2 are circular in planar shape as example. Alternatively, the memory holes MA1 and MA2 may be oval, cocoon-like, or polygonal in planar shape.

Second Embodiment

FIGS. 6A to 6E and 7A to 7D are cross-sectional views illustrating a manufacturing method of a semiconductor device according to a second embodiment.

Referring to FIG. 6A, a stacked body TA1 is formed on a base layer 1. In the stacked body TA1, insulation layers 2 and 3 of different materials are alternately stacked by a method such as CVD. Then, an insulation layer 4 is formed on the stacked body TA1 by a method such as CVD.

Next, an APF 7 is formed on the insulation layer 4 by a method such as CVD. In addition, a DARC film 8 is formed on the APF 7 by a method such as CVD. Further, a resist pattern 9 is formed on the DARC film 8 by the use of a photolithography technique. The resist pattern 9 has an opening 9A.

Next, as illustrated in FIG. 6B, the DARC film 8 and the APF 7 are etched with the resist pattern 9 as a mask to transfer the opening 9A to the DARC film 8 and the APF 7. Then, the stacked body TA1 and the insulation layer 4 are etched with the APF 7 to which the opening 9A is transferred as a mask to form a memory hole MA11 in the stacked body TA1 and the insulation layer 4. The memory hole MA11 can be formed vertically to the stacked body TA1. After the formation of the memory hole MA11, the APF 7 is removed by a method such as ashing.

Next, as illustrated in FIG. 6C, a sacrifice film 10 is embedded in the memory hole MA11 by a method such as CVD.

Next, as illustrated in FIG. 6D, the sacrifice film 10 is etched back to remove the sacrifice film 10 from a top position 4A of the insulation layer 4.

Next, as illustrated in FIG. 6E, the insulation layer 4 is selectively etched to thin the insulation layer 4. At that time, the sacrifice film 10 can be protruded in a convex shape from the insulation layer 4. Accordingly, a protrusion portion 10A as part of the sacrifice film 10 can be arranged on the memory hole MA11. The insulation layer 4 may be etched by wet etching or dry etching such as RIE. The etching agent for wet etching may be dilute hydrofluoric acid, for example.

Next, as illustrated in FIG. 7A, a stacked body TA2 is formed on the insulation layer 4 and the sacrifice film 10. In the stacked body TA2, insulation layers 12 and 13 of different materials are alternately stacked by a method such as CVD.

At that time, steps 13A are formed on the lower surfaces of the insulation layers 13 in correspondence with the protrusion portion 10A. Steps 13B are formed on the upper surfaces of the insulation layers 13 in correspondence with the protrusion portion 10A. Film thickness differences are generated at the positions of the steps 13A and 13B on the insulation layers 13. That is, thick portions KP are formed between the steps 13A and 13B on the insulation layers 13, and thin portions NP are formed between the inside of the steps 13A and the outside of the steps 13B.

Next, an insulation layer 14 is formed on the stacked body TA2 by a method such as CVD. At that time, a step 14A is formed on the insulation layer 14 in correspondence with the protrusion portion 10A.

Next, as illustrated in FIG. 7B, an APF 15 is formed on the insulation layer 14 by a method such as CVD. In addition, a DARC film 16 is formed on the APF 15 by a method such as CVD. Further, a resist pattern 17 is formed on the DARC film 16 by the use of a photolithography technique. The resist pattern 17 has an opening 17A. In the example of FIG. 7B, the central position of the opening 17A is misaligned with the central position C1 of the memory hole MA11.

Next, as illustrated in FIG. 7C, the DARC film 16 and the APF 15 are etched with the resist pattern 17 as a mask to transfer the opening 17A to the DARC film 16 and the APF 15. In addition, the stacked body TA2 and the insulation layer 14 are etched with the APF 15 to which the opening 17A is transferred as a mask to form a memory hole MA12 in the stacked body TA2 and the insulation layer 14. At that time, the memory hole MA12 can be inclined in the stacked body TA2. After the formation of the memory hole MA2, the APF 15 is removed by a method such as ashing.

Next, as illustrated in FIG. 7D, the sacrifice film 10 is selectively etched to remove the sacrifice film 10 from the memory hole MA11. After that, the process of FIGS. 4A to 4C is performed to form memory cells MC1 and MC2 in the stacked bodies TA1 and TA2.

Before the formation of the stacked body TA2, the protrusion portion 10A as part of the sacrifice film 10 can be formed to form film thickness differences at the positions of the steps 13A and 13B on the insulation layer 13. Accordingly, the central position C2L of bottom surface of the memory hole MA12 can be made close to the central position C1 of the memory hole MA11, thereby improving the accuracy of joining the memory hole MA11 and the memory hole MA12 in a self-alignment manner. Forming the protrusion portion 10A as part of the sacrifice film 10 eliminates the need for formation of the protrusion portion 11A of FIG. 2C, thereby reducing the number of steps.

Third Embodiment

FIGS. 8A to 8E are cross-sectional views illustrating a manufacturing method of a semiconductor device according to a third embodiment.

Referring to FIG. 8A, after the process of FIGS. 1A to 1D and 2A to 2D, an insulation layer 21 is formed on an insulation layer 14 by a method such as CVD. The insulation layer 21 can be formed from a material different from the insulation layer 14. The insulation layer 21 may be formed from the same material as insulation layers 13. For example, the insulation layer 21 can be formed from a silicon nitride film.

Next, as illustrated in FIG. 8B, the insulation layer 21 is thinned by a method such as chemical mechanical polishing (CMP) or is etched back to flatten the insulation layer 21.

Next, as illustrated in FIGS. 8C to 8E, a memory hole MA2 is formed on the memory hole MA1 by the same method as illustrated in FIGS. 3A to 3C. In addition, by performing the process of FIGS. 4A to 4C, memory cells MC1 and MC2 can be formed in stacked bodies TA1 and TA2.

Before the formation of an APF 15 on the insulation layer 14, providing the insulation layer 21 on the insulation layer 14 makes it possible to flatten the formation surface of the APF 15 and improve the accuracy of alignment of an opening 17A.

Fourth Embodiment

FIGS. 9A to 9D are cross-sectional views illustrating a manufacturing method of a semiconductor device according to a fourth embodiment.

Referring to FIG. 9A, after performing the process of FIGS. 6A to 6E, 7A, and 8A, an insulation layer 21 is thinned by a method such as CMP or is etched back to flatten the insulation layer 21.

Next, as illustrated in FIGS. 9B to 9D, a memory hole MA12 is formed on a memory hole MA11 by the same method as illustrated in FIGS. 7B to 7D. In addition, by performing the process of FIGS. 4A to 4C, memory cells MC1 and MC2 can be formed in stacked bodies TA1 and TA2.

Before the formation of an APF 15 on an insulation layer 14, providing the insulation layer 21 on the insulation layer 14 makes it possible to flatten the formation surface of the APF 15 and improve the accuracy of alignment of an opening 17A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
    forming a first stacked body in which first insulation layers and second insulation layers are alternately stacked;
    forming an intermediate layer on the first stacked body;
    forming a first hole penetrating through the first stacked body and the intermediate layer;
    embedding a sacrifice film in the first hole;
    removing the sacrifice film positioned on the intermediate layer;
    forming a protrusion portion protruding from the intermediate layer at the position where the sacrifice film is removed;
    forming, on the intermediate layer, a second stacked body in which third insulation layers and fourth insulation layers are alternately stacked to cover the protrusion portion;
    forming a second hole penetrating through the second stacked body, the intermediate layer, and the protrusion portion; and
    removing the sacrifice film from the first hole, wherein
    first steps are provided on lower surfaces of the fourth insulation layers in correspondence with the protrusion portion,
    second steps are provided on upper surfaces of the fourth insulation layers in correspondence with the protrusion portion, and
    the fourth insulation layers are provided with film thickness differences at positions of the first steps and the second steps.

2. The manufacturing method of the semiconductor device of claim 1, wherein a central position of a top surface of the second hole is misaligned with a central position of a bottom surface of the second hole.

3. A manufacturing method of a semiconductor device, comprising:
    forming a first stacked body in which first insulation layers and second insulation layers are alternately stacked;
    forming an intermediate layer on the first stacked body;
    forming a first hole penetrating through the first stacked body and the intermediate layer;
    embedding a sacrifice film in the first hole;
    removing the sacrifice film positioned on the intermediate layer;
    forming a protrusion portion protruding from the intermediate layer at the position where the sacrifice film is removed;
    forming, on the intermediate layer, a second stacked body in which third insulation layers and fourth insulation layers are alternately stacked to cover the protrusion portion;
    forming a second hole penetrating through the second stacked body, the intermediate layer, and the protrusion portion; and
    removing the sacrifice film from the first hole, wherein
    forming the protrusion portion includes;
    embedding an embedding material at the position where the sacrifice film is removed; and
    thinning the intermediate layer to protrude the embedding material.

4. A manufacturing method of a semiconductor device, comprising:
    forming a first stacked body in which first insulation layers and second insulation layers are alternately stacked;
    forming an intermediate layer on the first stacked body;
    forming a first hole penetrating through the first stacked body and the intermediate layer;
    embedding a sacrifice film in the first hole;
    removing the sacrifice film positioned on the intermediate layer;
    forming a protrusion portion protruding from the intermediate layer at the position where the sacrifice film is removed;
    forming, on the intermediate layer, a second stacked body in which third insulation layers and fourth insulation layers are alternately stacked to cover the protrusion portion;
    forming a second hole penetrating through the second stacked body, the intermediate layer, and the protrusion portion; and
    removing the sacrifice film from the first hole, wherein
    the intermediate layer includes a first oxide film and a second oxide film, and
    the first oxide film is a tetraethyl orthosilicate (TEOS) film formed by low pressure chemical vapor deposition (LPCVD), and the second oxide film is a TEOS film formed by plasma CVD.

* * * * *